United States Patent [19]

Pye

[11] 4,008,083
[45] Feb. 15, 1977

[54] STABILIZATION OF COLOR IMAGES FORMED BY PHOTOMODULATION OF THE CHRISTIANSEN EFFECT

[75] Inventor: Donald George Pye, Wilmington, Del.

[73] Assignee: E. I. Du Pont de Nemours and Company, Wilmington, Del.

[22] Filed: Jan. 20, 1976

[21] Appl. No.: 650,800

[52] U.S. Cl. .................................. 96/27 R; 96/67; 96/115 P; 350/312; 350/160 R
[51] Int. Cl.² ........................................ G03G 5/04
[58] Field of Search ................ 96/27 R, 67, 115 P; 350/160 R, 312

[56] References Cited

UNITED STATES PATENTS 3,951,520  4/1976  Waring, Jr. .................... 350/160 R

*Primary Examiner*—John D. Welsh

[57] ABSTRACT

A method of stabilizing a color image resulting from the photomodulation of a Christiansen cell is provided by adding a cross-linking monomer to an optically homogeneous, photopolymerizable medium of a Christiansen cell in an amount sufficient to produce cross-linked polymer upon exposure to actinic light which stabilizes the color image formed and maintains the optical homogeneity of the medium. An improved color image can be formed by also adding to the medium a small amount of a nitroso dimer.

15 Claims, 5 Drawing Figures

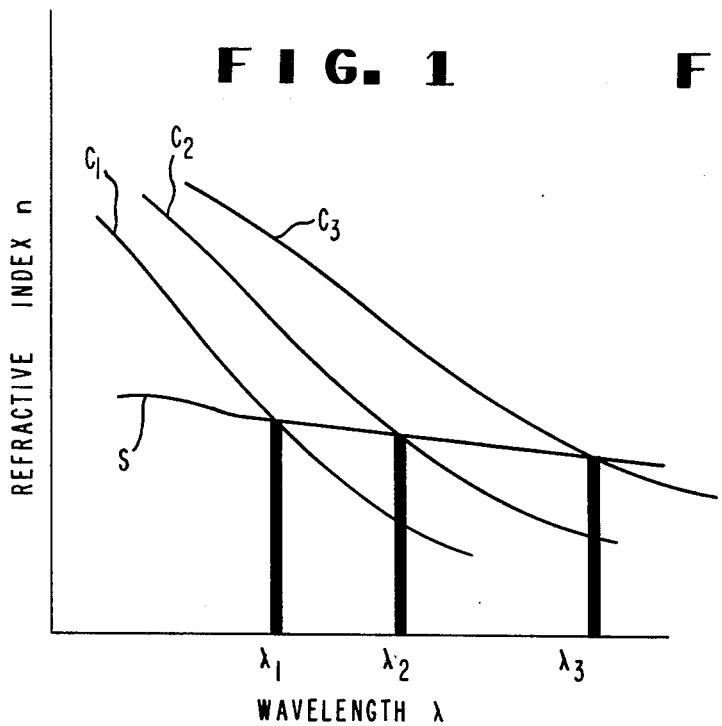
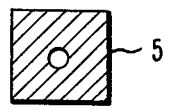
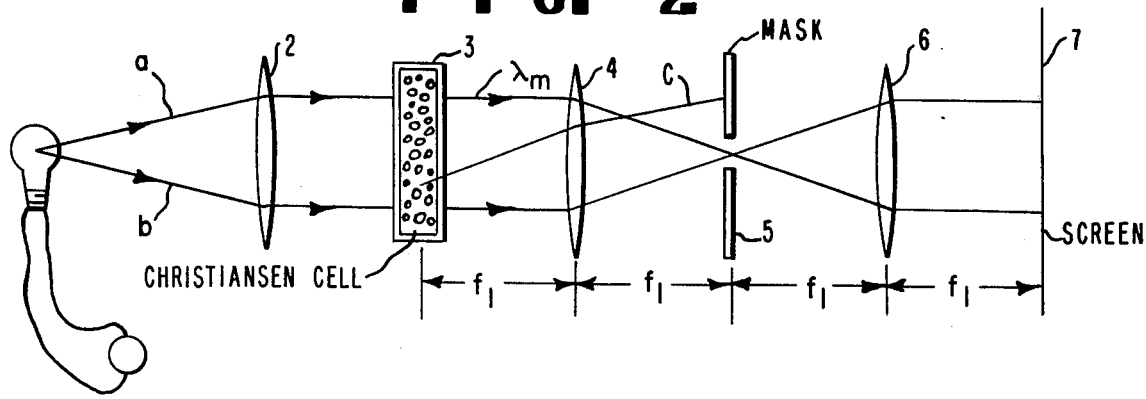
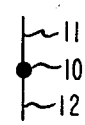
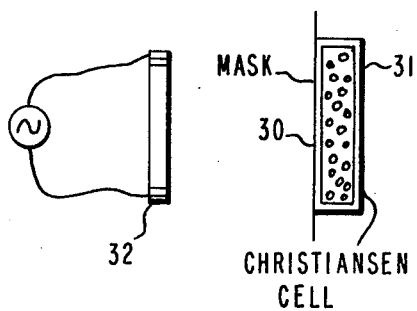

STABILIZATION OF COLOR IMAGES FORMED BY PHOTOMODULATION OF THE CHRISTIANSEN EFFECT

BACKGROUND OF THE INVENTION

1. Field of the Invention

This invention relates to Christiansen cells and methods of stabilizing the color images obtained with such cells and more particularly to such cells and methods which use photopolymerizable monomers to imagewise modulate the Christiansen effect.

2. Description of the Prior Art

A. Christiansen Cell Prior Art

It is well known that, in general, a train of light waves changes direction, i.e., is refracted, when it crosses a boundary separating two media of different indices of refraction and that, except in special cases, only a portion of the incident light passes into the second medium, the remainder being reflected. The directions of propagation of both the reflected and transmitted waves are different from that of the incident wave.

These phenomena are exploited in the Christiansen filter which produces a narrow band pass of color and which has application in the infrared and ultraviolet as well as in the visible region. This filter was first described by C. Christiansen in 1884. The Christiansen filter consists of a finely divided transparent material suspended in an optically homogeneous medium; the constituents are chosen so that they have different but intersecting dispersion curves, i.e., the refractive indices are identical at a particular wave length $\lambda_c$ in or near the visible region, but differ for all other wave lengths. The filter is optically homogeneous for light of wave length $\lambda_c$, i.e., such light is unaffected and passes through the filter without deviation or reflection. However, for all other wavelengths the filter is optically heterogeneous and such light is scattered as a result of the refraction and reflection which occur at the particle-medium interfaces. The degree of scattering for a given wavelength depends on the difference in the two refractive indices at that wavelength so that greater scattering is expected for wavelengths farther from $\lambda_c$. Consequently, the transmission curve for the unscattered light exhibits a maximum at $\lambda_c$.

The only disclosure of the formation of color images by imagewise modulation of the Christiansen effect is contained in the commonly assigned patent application U.S. Ser. No. 515,406, filed Oct. 16, 1974, to Waring now U.S. Pat. No. 3,951,520. A Christiansen cell is formed with a mixture of two immiscible condensed phases having dispersions of refractive index different from each other but with indices of refraction matching at one wavelength in the vicinity of the visible region of the spectrum. The refractive index of one phase (or both) is then locally changed in accordance with a predetermined image so that the matching wavelength changes. Light is passed through the cell and the scattered and unscattered components of the light emerging from the cell are separated and either component is then focused to form a colored image. The use of photopolymerizable monomers is disclosed as one method of achieving imagewise modulation of the Christiansen effect with the various degrees of polymerization causing corresponding shifts in the dispersion curve of the continuous phase. The sharpness of images formed with such cells is gradually lost due to the combined diffusion of polymer formed and monomer across the image boundaries.

B. Photopolymerization Prior Art

This prior art involves the photopolymerization of di- or multifunctional monomers to form scatter image systems. Imagewise exposure of these materials to actinic light results in regions of insoluble polymer that separate from the medium and subsequent image formation is dependent on the scattering of incident light by these polymerized regions. The scattering efficiency depends on the physical differences, in particular, the difference in the indices of refraction of the particulate, insoluble, photopolymerized material and the unexposed material. For example, Rust, U.S. Pat. No. 3,649,495 discloses a method of polymerizing vinyl monomers using a photo-redox system to form generally opaque images. Rust, U.S. Pat. No. 3,615,627 describes methods for preparing clear solutions of multivalent metal salts of acrylic acids with acrylic and methacrylic acids and for preparing clear photosensitive films from these mixtures. The amount of material polymerized, and therefore the optical density of a given region, depends upon the exposure that region receives. The use of a multivalent metal salt which increases the difference in the index of refraction of the polymer and that of the unexposed solution is emphasized. In another example of this general approach, Rust, U.S. Pat. No. 3,726,688 describes compositions which use acrylic materials that can be polymerized both by photoinitiation and by acidcatalyzed condensation. After photopolymerization has been used to form a photoimage of light scattering polymer, the photosensitive composition is heated to cause a latent catalyst to form an acid to condensation polymerize the remaining monomer. All of the monomer is polymerized, i.e., both the image and background areas, and this invention relies on the physical difference between the fixed photopolymerized and the condensation-polymerized monomers to produce an image. The invention thus provides a method for stabilizing such images with respect to further exposure to actinic light by densensitizing the areas which were unexposed when the image was formed. All of the above examples provide black and white images although Rust, U.S. Pat. No. 3,726,688 discloses the use of certain photochromic dyes to provide colored systems.

C. Photopolymerization in Printing Plates

Printing plate prior art involves the use of cross-linking to stabilize photopolymer images used as printing plates, in reproduction processes, etc. The photosensitive material consists of di- or multifunctional monomers, multifunctional monomers in conjunction with monofunctional monomers, or in some cases these monomers in conjunction with polymers. In order to maximize the difference in whatever property is used to distinguish the light-exposed and the unexposed regions, it is desirable to have complete polymerization, i.e., complete incorporation of the monomers into chains, in the light-exposed regions. For example, one method of making relief images for use as printing plates is to form a rigid, insoluble polymerized mass, i.e., a resist that cannot be washed away with the soluble unexposed material. Typical examples of such photopolymerizable compositions and elements useful in preparing printing reliefs are given below.

Plambeck, U.S. Pat. No. 2,760,863 discloses the use of a photopolymerizable material composed of a single monomer, admixtures of monomers, or monomers containing addition polymers. Preferably, there is an appreciable proportion of ethylenically-unsaturated polymerizable material containing a plurality of polymerizable linkages per molecule, i.e., a cross-linking agent. As a result, material in the exposed areas is substantially completely polymerized and rendered insoluble in a solvent which is suitable for washing away the unexposed material. Martin and Barney, U.S. Pat. No. 2,927,022 disclose the use of photopolymerizable material composed of an addition-polymerizable, ethylenically unsaturated component and a polymer component, preferably a cellulose ether or ester containing lateral acidic groups, which is water or aqueous base-soluble thereby allowing these convenient materials to be used as solvents for washing away the unexposed regions. Hard, sharp, relief images result. Skoultchi, U.S. Pat. No. 3,574,617 discusses the use of photosensitive compositions that are prepared from a copolymer containing moieties derived from at least one vinyl monomer and at least one ethylenically unsaturated derivative of a substituted benzophenone. Cross-linking and insolubilization occur on exposure of the polymer film.

Other reproduction processes rely on the difference of the stick or transfer temperatures of the unexposed, unpolymerized material and the exposed, polymerized material. Upon heating to a temperature above the stick temperature of the unexposed material, but below that of the exposed material, a relief image corresponding to the unexposed material can be transferred to a receptive support. Complete polymerization in the exposed areas is desirable to insure a rigid, adhesive material. Burg and Cohen, U.S. Pat. No. 3,060,023 disclose this process and teach that the additionpolymerizable component is preferably an ethylenically unsaturated monomer having two terminal ethylenic groups.

Colgrove, U.S. Pat. No. 3,353,955 describes still another property which can be used to separate the exposed polymerized and the unexposed unpolymerized compositions. The photopolymerizable composition is comprised of a suitable binder and an ethylenically unsaturated monomer and is laminated between two supporting films at least one of which is transparent. The photopolymerizable composition is further characterized in that at room temperature in its polymerized state it has greater adhesion for one support than the other and in its unpolymerized state it has greater adhesion for the second support than for the first. After exposure the supporting films are separated by peeling them apart and the exposed areas adhere to the one support to form a negative image while the unexposed areas adhere to the other support to form a positive image. Schwerin, U.S. Pat. No. 3,234,021 describes a photosensitive coating consisting of a polymerizable vinyl monomer such as acrylamide and a cross-linking agent such as N,N'-methylene bisacrylamide. After exposure, the coating is moistened and squeezed against another support such as paper to effect transfer to the second support of the unpolymerized portions. The cross-linking agent increases the hardness of the exposed regions so that they will not be transferred to the second support.

In all of the photopolymerization work described above the goal is to maximize the differences between the exposed and the unexposed regions and this is accomplished by effecting substantially complete polymerization in the exposed regions. There is no objective for producing partially polymerized regions nor for stabilizing such an image.

In prior art relating to a different aspect of the instant disclosure, Pazos (in a commonly assigned patent application Ser. No. 550,660, filed Feb. 18, 1975,) discloses the addition of a nitroso dimer to a photopolymerizable composition to inhibit thermal polymerization. The nitroso dimer, which is a noninhibitor of free-radical polymerization, thermally dissociates to nitroso monomer which is an inhibitor. There is no mention of the use of this dimer to stabilize images against change due to postexposure polymerization. For most of the photopolymerization applications in which the exposed areas are completely polymerized and the unexposed unpolymerized areas are subsequently removed, postexposure polymerization is no problem.

SUMMARY OF THE INVENTION

According to the present invention there is provided in a method of forming a colored image by projection of light through an imaged Christiansen cell so that the light is separated into scattered and unscattered components either of which is focused on a viewing surface, said Christiansen cell having two constituents of different optical dispersion but having identical refractive indices at a matching wave length in or near the visible spectrum, the constituents being a discrete phase dispersed in an optically homogeneous polymerizable medium whose refractive index is locally changed by polymerization, the improvement comprising forming an optically homogeneous, photopolymerizable medium containing a polymerizable monomer and a cross-linking monomer in an amount sufficient to produce upon exposure to actinic light cross-linked polymer which stabilizes the colored image formed and is optically homogeneous with any remaining medium; and exposing the Christiansen cell to varying intensities of actinic light in accordance with a predetermined image.

There is also provided a Christiansen cell having as its operating element a dispersion of a transparent, isotropic solid in a photopolymerizable medium which is an optically homogeneous mixture of: (1) at least one ethylenically unsaturated monomer; (2) at least one cross-linking monomer for said unsaturated monomer in an amount sufficient to produce cross-linked polymer, which polymer maintains the optical homogeneity of the medium; and (3) an initiating amount of an actinic light-activatable photoinitiator which does not form gaseous or insoluble products. In a preferred aspect of this cell, a small amount of nitroso dimer is added as a source of polymerization inhibitor and, when desired, material is added to adjust the refractive index of the photopolymerizable medium.

BRIEF DESCRIPTION OF THE DRAWINGS

In the drawings,

FIG. 1 is a diagram illustrating the manner in which varying the refractive index of one component will vary the color of light directly transmitted through a Christiansen filter;

FIG. 2 is a diagram illustrating an embodiment of this invention;

FIG. 3 is a plane view of a stop employed for spatial filtering in the embodiment of FIG. 2;

FIG. 4 illustrates an alternative form of stop for use in the apparatus of FIG. 2 to produce an image of complementary color; and FIG. 5 illustrates apparatus for varying the polymerizable medium of the Christiansen cell imagewise by photopolymerization.

DETAILED DESCRIPTION OF THE INVENTION

The present invention employs a Christiansen cell which is modulated imagewise by locally varying the refractive index of the continuous medium. This change is accomplished by photopolymerizing to various degrees (e.g., by different light intensities) a light-sensitive medium containing an ethylenically unsaturated monomer and a cross-linking monomer. The light sensitivity may be enhanced by inclusion of a photosensitive initiator reactive to the actinic light.

The Christiansen cell also contains a solid phase which is homogeneous, isotropic (as to light transmission) and transparent through the visible and near visible regions of the spectrum. In the present invention it is preferred to employ ground glass, glass spheres or the like as the solid phase.

This solid phase is dispersed in an optically homogeneous photopolymerizable, monomer-containing medium, the aggregate of the two forming the operating element of the Christiansen cell. If the medium is a liquid, the aggregate is confined in a container, e.g., a slurry of the solid in the liquid is held between two spaced plates. If the medium is a solid or semi-solid, the aggregate may be coated onto a film or plate and, if desirable, covered with a top film, sheet, or plate. The plates containing or supporting the aggregate must be transparent to light in the visible region of the spectrum and the plate or film through which the exposure is made must also be transparent to the actinic radiation if it falls outside the visible, e.g., in the ultraviolet.

Turning now to FIG. 1, the diagram is a hypothetical plot of the variation of refractive index ($n$) with wavelength $\lambda$ in the vicinity of the visible region of the spectrum and is intended to illustrate this invention.

S represents the variation of refractive index of a solid with wavelength and $C_1$ represents the variation of the refractive index of a medium with wavelength $\lambda_1$. For light of wavelength $\lambda_1$, a Christiansen cell composed of this solid in powdered form suspended in this medium will be optically homogeneous. Thus, such a cell with pass light of $\lambda_1$ substantially unchanged in direction assuming the cell has parallel walls. Light of wavelengths substantially different from $\lambda_1$ will be scattered. The band pass of the cell will be determined by the relative slopes of dispersion curves S and $C_1$.

Light of wavelength $\lambda_1$ forms the background of the image in the instant invention when the unscattered component of light transmitted by the cell is employed. $\lambda_1$ may be in the visible region of the spectrum whereupon the background will be colored. Alternatively, $\lambda_1$ can be just outside the visible region of the spectrum whereupon the background will be dark. If the refractive index is locally changed in accordance with some predetermined image, the dispersion curve will shift, say, to $C_2$, and the matching wavelength will shift to $\lambda_2$. A greater degree of change will further shift the dispersion curve to $C_3$ with matching wavelength $\lambda_3$. Both $\lambda_2$ and $\lambda_3$ should be in the visible region of the spectrum to project an observable image unless ultraviolet or infrared sensors are employed. Further, it will be apparent that, although the greater the difference in the slopes of the dispersion curves (e.g., S and $C_1$) the more pure is the color transmitted by the cell, the greatest change in matching wavelength for a given change of refractive index is obtained when the dispersion curve for the medium has a slope which differs only slightly from that of the discrete phase.

FIG. 2 shows the method of obtaining an image of the unscattered light passing through a Christiansen cell. A white light source is collimated by lens 2. The beam of light represented by rays $a$ and $b$ impinges on a Christiansen cell 3 containing a suspension of a powdered solid, for example, glass, suspended in a medium having an appropriate dispersion characteristic. Light of the matching wavelength $\lambda_m$ passes undeflected through the cell and is brought to a focus by imaging lens 4. A spatial filter consisting of a small aperture in an opaque screen 5 permits passage of the undeflected light which is then imaged by lens 6 on screen 7. Where light of wavelength $\lambda_m$ is transmitted unscattered by a portion of the cell, the image of that portion of the cell will appear on screen 7 in the color $\lambda_m$. Substantially all light scattered by the cell such as ray C is not brought to a focus by lens 4 and is stopped by the spatial filter 5. FIG. 3 is a plane view of spatial filter 5. If, instead of an aperture, a small stop such as that shown by 10 in FIG. 4, which is supported at the focus by thin wire supports 11 and 12 is employed as the spatial filter, the component of light scattered by Christiansen cell 3 will pass the spatial filter and can be imaged on screen 7 to obtain an image in colors complementary to those obtained when the undeflected light component is imaged on the screen. The non-scattered light is focused on the stop and will not pass.

In the Christiansen cells of this invention, partial or total photopolymerization of the polymerizable, ethylenically unsaturated monomer and cross-linking monomer contained in the medium modifies the index of refraction according to the local degree of polymerization which occurs in accordance with a predetermined image. In the preparation of this medium, the constituents must be so chosen as to provide an optically homogeneous mixture whose refractive index will match that of the disperse phase for some appropriate wavelength in or near the visible region. Further, the polymer formed during exposure must also be optically homogeneous with the remaining medium and not form a third phase which will scatter transmitted light. If a third phase is present, there will be various degrees of scattering at all wave-lengths and no light will be transmitted unscattered. This will give grey or brownish black transmitted images. The terms optical homogeneity or optically homogeneous mean that the medium both before and after exposure to actinic light will transmit light without scattering.

In addition, when the disperse phase has low optical dispersive power, the medium constituents should be chosen to give a medium of high dispersive power so that colors will have the desired saturation (i.e., high color purity). Dispersive power describes the variation in refractive index with wavelength. Curve S in FIG. 1 shows a phase with low dispersive power.

In its simplest form, the medium of the present invention is prepared by blending the chosen ethylenically unsaturated monomer a minor amount of cross-linking monomer and photoinitiator. The refractive index of the medium is adjusted to a desired value by the further addition of a diluent of higher or lower refractive index as necessary to obtain an index which matches that of the chosen disperse phase powder at an acceptable wavelength. The resulting liquid is then blended with a suitable amount of the disperse phase power to yield a mildly viscous liquid which is thoroughly degassed by evacuation and spread between glass plates that are separated by a peripheral spacer, and the whole cell is enclosed in a suitable holder.

In one form the final composition is liquid e.g., the ethylenically unsaturated monomer being an aromatic ester of acrylic or methacrylic acid; the cross-linking monomer being a di- or triacrylic or methacrylic ester; the photoiniator, a benzoin derivative; the additives, suitable for refractive index adjustment and preferably aromatic containing materials; and the disperse phase, a powdered glass with index of refraction matching that of the medium at one wavelength.

In another form the final mixture is solid or semisolid. The monomers and initiators are blended with sufficient polymer, disperse phase and removable solvent so that the mixture can be coated or calendered onto a conventional film base on solid substrate to yield, after solvent removal, a non-flowing coating on a flexible or rigid base. The coating can, optionally, be covered with a clear top sheet.

In a preferred modification of the above forms, a small amount of a nitroalkane dimer, e.g., nitrosocyclohexane dimer, is also added. These materials dissociate slightly to form a small equilibrium amount of monomeric material which is an effective free radical trap, but the reaction is sufficiently slow so that during the imaging exposure the available monomeric form is rapidly consumed in early exposure stages and imaging can then proceed. After exposure is completed, a new equilibrium amount of monomer forms and effectively stabilizes the image against further change due to post-exposure polymerization caused by residual initiator.

A wide range of materials may be used in the Christiansen cell of this invention but it will be appreciated that the requirements of (1) optical homogeneity both of the initial photosensitive composition and of the polymerized materials and (2) the matching of refractive indices of the photopolymerizable medium and disperse phases, dictate the precise combinations and relative quantities of the constituents.

The primary monomeric constituents are ethylenically unsaturated compounds capable of polymerizing in the presence of a photoinitiator which is activatable by actinic light. The preferred materials are liquid or those that will readily form liquid mixtures and are the aromatic esters of acrylic or methacrylic acids exemplified by 1-naphthyl methacrylate, pentabromophenyl methacrylate, pentachlorophenyl methacrylate, 3-acryloxybenzophenone, 2-naphthyl methacrylate and other polymerizable aromatic materials such as N-vinyl carbazole. Combinations of such materials can also be employed provided the optical requirements described previously are satisfied.

The present invention uses a cross-linking monomer to react with the ethylenically unsaturated monomer upon exposure to actinic light and, thus, stabilize the resulting polymer and image formed. A cross-linking monomer is one having a plurality of ethylenically unsaturated groups. Any cross-linking monomer can be used as long as the resulting cross-linked system is optically homogeneous. Preferred cross-linking monomers are liquid or those that will readily form liquid mixtures. Representative of such monomers are divinyl compounds such as divinyl benzene or di- or triacrylates or di- or trimethacrylates derived from the reaction of either acrylic acid or methacrylic acid (or esters, preferably alkyl esters, of these acids) with either an organic diol or triol of 2–10 carbon atoms such as ethylene glycol, and the polyethylene glycols, e.g., diethylene glycol, triethylene glycol, tetraethylene glycol, or mixtures of these ether alcohols; polymethylene glycols, e.g., trimethylene glycol, hexamethylene glycol. These latter compounds can be represented by the formula:

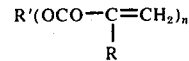

wherein
 $n$ is 2 or 3;
 R is —H or —$CH_3$; and
 R′ is a divalent or trivalent aliphatic or aromatic radical of 2–10 carbon atoms such as alkylene, alkylene oxide, arylene, arylalkylene.

Illustrative cross-linking monomers are: divinyl benzene, ethylene dimethacrylate, diethylene glycol dimethacrylate, triethylene glycol dimethacrylate, p-xylylene dimethacrylate, naphthylene dimethacrylate, 1,10-decanediol dimethacrylate, 2,2-dimethylpropanediol dimethacrylate, 1,6-hexanediol dimethacrylate, and the corresponding diacrylate compounds. Trifunctional compounds, e.g., 1,2,6-hexanetriol triacrylate, 1,1,1-trimethylol ethane trimethacrylate are also useful.

The refractive index of a medium may not match sufficiently closely that of the discrete phase and additives of higher or lower index may be used to adjust the medium index. In addition, it may be desirable to include constituents to adjust the viscosity of the medium. Whatever the purpose, additives employed to adjust refractive index, control viscosity or act as filler — particularly in the form in which the photosensitive layer is coated on substrates — must likewise fulfill the requirement of optical homogeneity with the other constituents. Thus, the nature of these additives will depend to some degree on the choice of primary ethylenically unsaturated monomer and stabilizing cross-linking monomer. When the primary monomer is one of the preferred aromatic esters of acrylic or methacrylic acids, materials such as poly(1-naphthyl methacrylate), poly (vinyl naphthalene), chlorinated polyphenyls and other aromatics such as 1-chloronaphthalene are particularly useful since they not only have high refractive indices but also have high optical dispersive powers; as a result the dispersive power of the medium is increased with respect to the low dispersive power of the preferred powdered glass phase thereby enhancing color purity.

The problems of polymer compatibility and therefore opticaly homogeneity in media such as those used in this invention can frequently be overcome by the use of copolymers as additives to control refractive index or viscosity. Thus, a mixture having a desired refractive index might by obtained using proportions of poly(-methyl methacrylate) and poly (1-naphthyl methacrylate). However, the polymers are incompatible in the systems of this invention and lead to optical inhomogeneity. Poly(vinyl naphthalene) and poly(1-naphthyl methacrylate) are likewise incompatible. These difficulties can be overcome by using copolymers of compositions designed to give a desired refractive index. Poly(1-cinnamyl methacrylate/1-naphthyl methacrylate has been particularly useful in conferring desired properties of refractive index and optical homogeneity. It will be appreciated, however, that other similar copolymers will be useful in other compositions of this invention that employ other types of primary monomers.

Photoinitiators activatable by actinic light are added to the monomers to shorten ultraviolet exposure times. Many such compounds are known, and many are described in U.S. Pat. No. 2,760,863. Preferred initiators are those which do not form gaseous, insoluble, or highly colored products and which have high optical dispersive power. Illustrative initiators are acyloin ethers such as benzoin methyl or ethyl ethers. The preferred initiator is benzoin methyl ether.

The use of nitroso dimers that undergo dissociation to form radical traps as stabilizers to prevent either premature polymerization or post-exposure polymerization has already been described. Nitrosoalkane dimers such as those described in the aforesaid Pazos application U.S. application Ser. No. 550,660 are preferably used in this invention. A particularly preferred nitroso dimer is nitrosocyclohexane dimer. These dimers aid in maintaining the various degrees of polymerization which occur during imaging.

The useful concentration ranges of the constituents can best be described by taking the total weight of the medium as 100. The reaction monomers (i.e., the primary monomer plus cross-linking monomers) can vary from substantially 100 to as low as 10 parts by weight. At the upper limit, the small deviation is due to an amount of photoinitiator added to expedite polymerization. The lower limit is related only to the amount required to produce visible color images and it will be appreciated that greater color range will be obtained at the higher concentrations. In general, a concentration above about 30 parts by weight is preferred and normally it will be in the range of about 30–75 parts.

The remainder of the medium composition consists of additives used to control its various properties; the total of all constituents of the medium being 100 parts. The preferred initiator concentration is between about 0.1 and 20, preferably about 0.5 and 15 parts and is determined primarily by the reaction speed desired, the intensity of the actinic light used for exposure and the concentration of any optional nitroso dimer stabilizing agent present and its rate of dissociation to form monomeric material. It will be appreciated that the rate of formation of polymerization-initiating free radicals must exceed the rate of nitroso monomer formation if images are to be obtained. In general, the amount of nitroso dimer used can be from about 0.05 – 5 parts by weight, preferably from about 0.05 – 1 part. The amount of polymeric or other additives will also vary depending on the extent of refractive index adjustment required and on the desired nature of the final composition, i.e., liquid or solid. Thus, this concentration can very from 0 to about 90 parts by weight but will normally be in the range of about 20 – 65 parts.

The concentration of image stabilizing cross-linking monomer can best be related to that of the primary ethylenically unsaturated monomer. If the concentration is too low, e.g., less than 1 or 2% by weight of the primary monomer — a range often used in the polymer industry to establish tough, insoluble materials — insufficient stabilization of Christiansen images is obtained. On the other hand, the use of extremely high concentrations, as for example, those employed to produce scatter images will also be unsatisfactory because the cross-linking monomer will result in the formation of a third phase, as described earlier, and will not fulfill the requirement of optical homogeneity. It will be appreciated that the actual amount used for best results will depend somewhat on the color desired in the exposure and hence the amount of conversion to polymer that will occur. If low conversions are desired, better image-stabilizing results will be obtained by using higher concentrations of cross-linking monomer in order to achieve an adequate number of cross-links. Conversely, if higher conversions are sought to obtain larger color differentials from the unexposed materials, the amount of cross-linking monomer may be significantly less. The upper limit will also depend on the nature of the other constituents in the composition and their ability to prevent phase separation as for example through chemical affinity or through viscosity effects. In general, excellent results are obtainable if the amount of cross-linking monomer is in the range of about 5 – 50 parts and preferably about 7 – 40 parts based on a total monomer concentration of 100 parts by weight.

While a glass powder is then preferred disperse phase, other transparent, isotropic materials can be used. The glass concentration of the dispersion is normally around 60 parts by weight; however, the concentration can be in the range of about 30 – 85 parts by weight. The useful range is dependent largely on the density of the particulate material. A high concentration of very dense material can be accommodated. The actual value is not critical but high packing densities tend to provide better quality Christiansen cells. The glass powder can be prepared by first crushing the chosen glass and then milling it in a ball mill. The fraction of the resultant powder that passes a 400 mesh (37 micron) screen is a material of convenient particle size for use in the Christiansen cell, but larger particles may also be used. Care should be taken to avoid a high concentration of particles below about 1 micron in size. This size approaches the wavelength of visible light and tends to scatter all light, thus resulting in less pure Christiansen colors.

FIG. 5 shows a simple arrangement for imposing an image on a cell of the instant invention. A mask 30, which can be a photographic transparency, is placed in contact with the cell 31 and the cell is illuminated with a lamp 32, which can be a high pressure mercury arc, for the predetermined time necessary to accomplish the desired effect. If the mask 30 contains areas of different optical density, different degrees of photopolymerization will occur leading to different colors in the resultant image on projection. Changing the time of exposure in localized areas further alters the color in the exposed areas on projection.

It will be evident that other optical arrangements capable of imaging the mask onto the cell can be devised in place of the simple system of FIG. 5.

An advantage of the invention lies in the fact that the spatial distribution of polymer which exists at the completion of imaging is essentially maintained and the color image formed will remain sharp and useable over an extended period of time.

This invention is further illustrated by the following Examples in which all refractive indices were determined at ambient temperature.

In these embodiments, the apparatus of FIG. 2 was employed to project images from the exposed Christiansen cell.

EMBODIMENTS OF THE INVENTION

EXAMPLE 1

A mixture of 0.20 g Arochlor 1260, 0.30 g 1-naphthyl methacrylate, 0.05 g divinylbenzene; and 0.05 g 10% solution of benzoin methyl ether in 1-chloronaphthalene was prepared. This composition had a refractive index as measured on a Zeiss refractometer of $n_D = 1.605$. To this mixture was added 0.60 g of a powdered glass of nominal refractive index $n_D = 1.620$ prepared from an optical grade dense barium crown glass by crushing it, milling it in an agate ball mill and sieving out for use that portion which would pass a 400 mesh screen. A portion of the mixture was placed between 2-inch square clear glass slides having a peripheral spacer of 1 mil plastic film to maintain a uniform separation. The entire sandwhich was placed in an aluminum frame, thus forming a complete photosensitive Christiansen cell having a nominal 1 mil thickness of sensitive material. When the cell was placed in a simple optical device similar to that described in FIG. 2 in which transmitted light is separated from scattered light and both portions of light are focused on a transluscent screen for viewing, the transmitted light was blue and the complimentary scattered light was a golden yellow. Arochlor 1260 is a mixture of chlorinated polyphenyls manufactured by Monsanto Chemical Company. Divinyl benzene is commercial divinyl benzene as sold by Dow Chemical Company and stated by manufacturer to be about 55% active.

Portions of the cell were exposed for times varying from 1 to 15 minutes to uv light from a 100 watt, high pressure mercury arc through an appropriate negative to yield sharp Christiansen images varying in color from light greenish blue to reddish brown when viewed by transmitted light (placed in projector for example). Scattered light images were the corresponding complimentary colors ranging from light orange to blue in the same sequence. When viewed 7 days later, the image edges of all but those having the lowest exposure times had remained sharp and the colors were essentially the same. A second observation approximately 10 months later (during which time the slide had been stored in a slide box) revealed that all of the images retained their sharp edge characteristics and had essentially the same colors except for those having the lowest exposure times. These images had completely faded. The results show that images formed in photopolymerizable systems containing divinyl benzene as a stabilizing agent will remain stable for long periods of time if sufficient exposure to actinic light has been provided to form a good image.

EXAMPLE 2

A Christiansen photosensitive cell was prepared in the same manner as in Example 1 using a portion of a mixture containing 0.07 g Arochlor 1260, 1.20 g 1-naphthyl methacrylate, 0.2 g divinylbenzene (as in Example 1), 0.10 g 10% benzoin methyl ether in 1-methyl naphthalene, and 2.80 g glass powder ($n_D = 1.620$).

The cell was exposed to uv light through a negative composed of letters and half-tone material to yield a sharp Christiansen color image when viewed in an appropriate viewing box as in Example 1. After storage for 3 and 5 days aging, the images were again viewed and found to be sharp and to have essentially the same colors as observed originally. The half-tone dots had remained distinct.

This result and those of the other examples show significant image stabilization when difunctional monomers are incorporated. They are to be contrasted with the result of Control Example A which illustrates aging effects when no stabilizing agent is present.

Control A

A Christiansen photosensitive cell was prepared as in Example 1 using 0.30 g 1-naphthyl methacrylate and 0.05 g 10% benzoin methyl ether in 1-methylnaphthalene together with sufficient powdered glass ($n_D = 1.620$) to make a viscous mixture. The precise amount of glass affects only the amount of scattering and hence the color saturation but does not affect the polymerization reaction and image formation.

The unexposed cell was a deep blue when viewed by transmitted light and yellow by scattered light. Exposure to uv light through a negative yielded a very sharp yellow green to orange (transmitted light) image. After 1 day storage, the image edges were becoming diffuse and after 5 days storage only the main (large) parts of the image were discernible.

EXAMPLE 3

A composition containing 0.20 g Arochlor 1260, 0.30 g 1-naphthyl methacrylate, 0.10 g triethylene glycol diacrylate, 0.05 g 10% benzoin methyl ether in 1-methylnaphthalene, and 0.60 g powdered glass ($n_D = 1.603$) was prepared and formed into a Christiansen cell. The refractive index of the liquid phase was $n_D = 1.586$ and the glass powder was prepared in the same manner as in Example 1. Exposure through a line negative to uv light resulted in a sharp yellow green image on a blue (unexposed) background when viewed by transmitted light. The corresponding scattered light colors were purple and yellow. Reexamination after 4 and 8 days storage showed that the lines were still sharp and had retained their same colors. This example shows the use of a diacrylate as a stabilizing agent.

Examples 4-13 illustrate the use of a variety of multifunctional compounds as image stabilizing agents as well as the use of various monomers as primary reactants and various additives for refractive index and viscosity control.

EXAMPLE 4

A Christiansen photosensitive cell was prepared as in Example 1 using 0.30 g Arochlor 1260, 0.50 g 1-naphthyl methacrylate, 0.20 g triethylene glycol dimethacrylate, and 0.20 g 10% benzoin methyl ether in 1-methylnaphthalene together with sufficient powdered glass to produce a viscous slurry. The index of refraction of the liquid phase was $n_D = 1.581$ and that of the glass powder $n_D = 1.620$.

The image from exposure through a line negative was very sharp and little or no change had occurred after 11 days aging. The color of the image was a greenish yellow and the unexposed material was a bluish black as viewed by transmitted light. The very dark unexposed field is due to the relatively large difference in refractive indices of the liquid and solid.

EXAMPLE 5

A Christiansen photosensitive cell was prepared as in Example 1 using 0.40 g 85% Arochlor 1260 in 1-methylnaphthalene, 0.50 g 1-naphthyl methacrylate, 0.15 g ethylene dimethacrylate, and 0.20 g 10% benzoin methyl ether in 1-methylnaphthalene together with sufficient powdered glass to produce a viscous slurry. The index of refraction of the liquid phase was $n_D = 1.588$ and that of the glass powder $n_D = 1.620$. The line image following exposure to actinic light was sharp and no change was observed after 1 day aging.

EXAMPLE 6

A Christiansen photosensitive cell was prepared as in Example 1 using 0.35 g 85% Arochlor 1260 in 1-chloronaphthalene, 0.40 g 97% 1-naphthyl methacrylate in 1-methylnaphthalene, 0.20 g p-xylylene diacrylate, 0.15 g benzoin methyl ether, and 0.05 g 5% nitrosocyclohexane dimer in 1-chloronaphthalene together with sufficient powdered glass to produce a viscous slurry. The index of refraction of the liquid phase was $n_D = 1.595$ and that of the glass powder $n_D = 1.620$. Images formed through both a line negative and a continuous tone stepwedge remained sharp after aging for 1 day. After 5 days aging all images remained sharply defined although a small color change was observed due to equilibration of unpolymerized liquids between the image and non-image areas. A small amount of second phase material eventually formed in some strongly exposed areas during extended aging.

EXAMPLE 7

A Christiansen photosensitive cell was prepared as in Example 1 using 0.45 g 85% Arochlor 1260 in 1-chloronaphthalene, 0.40 g 95% 1-naphthyl methacrylate in 1-methylnaphthalene, 0.20 g 1,2,6-hexanetriol triacrylate, 0.15 g benzoin methyl ether, 0.05 g 5% nitrosocyclohexane dimer in 1-chloronaphthalene, 0.30 g 1-chloronaphthalene together with sufficient powdered glass to produce a viscous slurry. The index of refraction of the liquid phase was $n_D = 1.596$ and that of the glass powder $n_D = 1.620$. Images formed after this composition was exposed to actinic light were sharp and clear and after 49 days aging they still retained their sharp characteristics.

EXAMPLE 8

A Christiansen photosensitive cell was prepared as in Example 1 using 0.45 g 85% Arochlor 1260 in 1-chloronaphthalene, 0.40, g 95% 1-naphthyl methacrylate in 1-methylnaphthalene, 0.20 g 1,6-hexanediol diacrylate, 0.15 g benzoin methyl ether, 0.05 g 5% nitrosocyclohexane dimer in 1-chloronaphthalene, 0.05 g 50% Nujol (extra heavy mineral oil) in 1-methylnaphthalene and 0.30 g 1-chloronaphthalene together with sufficient powdered glass to produce a viscous slurry. The index of refraction of the liquid phase was $n_D = 1.594$ and that of the glass powder $n_D = 1.620$. Images formed after this composition was exposed to actinic light still retained their sharp characteristics after 46 days aging.

EXAMPLE 9

A Christiansen photosensitive cell was prepared as in Example 1 using 0.35 g 85% Arochlor 1260 in 1-chloronaphthalene, 0.40 g 95% 1-naphthyl methacrylate in 1-methylnaphthalene, 0.10 g p-xylylene diacrylate, 0.05 g 1,1,1-trimethylol ethane trimethacrylate, 0.15 g benzoin methyl ether, 0.05 g 5% nitrosocyclohexane dimer in 1-chloronaphthalene, 0.10 g 1-chloronaphthalene together with sufficient powdered glass to produce a viscous slurry. The index of refraction of the liquid phase was $n_D = 1.596$ and that of the glass powder $n_D = 1.620$.

A line image formed after this composition was exposed to actinic light remained sharp after 12 days aging.

EXAMPLE 10

A Christiansen photosensitive cell was prepared as in Example 1 using 0.50 g poly(1-vinylnaphthalene), 1.00 g 1-naphthyl methacrylate, 0.50 g 2-naphthyl methacrylate, 0.30 g triethylene glycol dimethacrylate, 0.20 g benzoin methyl ether, and 0.025 g 20% nitrosocyclohexane dimer in 1-chloronaphthalene together with sufficient powdered glass to produce a viscous slurry. The index of refraction of the liquid phase was $n_D = 1.593$ and that of the glass powder $n_D = 1.621$.

Images formed after this composition was exposed to actinic light remained sharp after 20 days aging.

EXAMPLE 11

A Christiansen photosensitive cell was prepared as in Example 1 using 0.50 g poly(1-vinylnaphthalene), 1.00 g 1-naphthyl methacrylate, 0.50 g pentabromophenyl methacrylate, 0.30 g triethylene glycol dimethacrylate, 0.20 g benzoin methyl ether, 0.30 g 1-chloronaphthalene, and 0.025 g 20% nitrosocyclohexane dimer in 1-chloronaphthalene together with sufficient powdered glass to produce a viscous slurry. The index of refraction of the liquid phase was $n_D = 1.600$ and that of the glass powder $n_D = 1.621$.

The image formed after this material was exposed to actinic light was still clear and sharp after 2 days aging.

EXAMPLE 12

A Christiansen photosensitive cell was prepared as in Example 1 using 0.50 g N-vinylcarbazole, 0.50 g 1-chloronaphthalene, 0.10 g triethylene glycol dimethacrylate, and 0.15 g benzoin methyl ether together with sufficient powdered glass to produce a viscous slurry. The index of refraction of the liquid phase was $n_D = 1.629$ and that of the glass powder $n_D = 1.651$.

Although this system is considerably less sensitive than those of previous examples, a suitably longer exposure gave a sharp image which remained after 1 day of aging. In contrast, images made on a control formulation identical with the above except that the dimethacrylate stabilizing agent was omitted had faded badly within a few hours. Although this system formed poorer quality images, significant stabilization was achieved.

EXAMPLE 13

A mixture of 2.00 g poly(cinnamyl methacrylate/-1-naphthyl methacrylate), 1.50 g 1-naphthyl methacrylate, 0.25 g p-xylylene diacrylate, 0.40 g benzoin methyl ether, 0.05 g 20% nitrosocyclohexane dimer in 1-chloronaphthalene, and 3.00 g xylene was prepared. Poly(cinnamyl methacrylate/1-naphthyl methacrylate) was prepared by thermally copolymerizing equal parts of cinnamyl methacrylate and 1-naphthyl methacrylate in a benzene solution using an azonitrile initiator. The polymer was precipitated from solution and washed prior to use.

This mixture had a refractive index, $n_D = 1.604$. It was filtered through a sintered glass filter and 5.0 g powdered glass, $n_D = 1.620$ was added and the entire mixture restirred to obtain a uniform slurry. The composition was thoroughly degassed by evacuation to remove air bubbles and was coated on a clear plastic (polyester) film base using a doctor knife set at 10 mil thickness. The coating was allowed to dry overnight to remove the volatile xylene solvent and the slightly tacky coating was then overlaid with a second sheet of clear film to prevent the line negative from adhering to it during exposure.

The photosensitive Christiansen film (about 5 mils thick) was exposed for different times as previously described and sharp, clear, different colored images were observed on projection. Examination after 18 days aging showed the projected images to have remained sharp and clear.

The following two control Examples show that excessive amounts of multifunctional monomers cannot be used because scatter images are formed due to the formation of a highly scattering third phase which destroys the Christiansen color and causes only dark, transmitted-light images.

CONTROL B

A Christiansen photosensitive cell was prepared as in Example 1 using 0.10 g triethylene glycol dimethacrylate, 0.50 g 85% Arochlor 1260 in 1-methylnaphthalene, 0.25 g 10% benzoin methyl ether in 1-methylnaphthalene, and 0.025 g 5% nitrosocyclohexane dimer in 1-chloronaphthalene together with sufficient powdered glass to produce a viscous slurry. The index of refraction of the liquid phase was $n_D = 1.603$ and that of the glass powder $n_D = 1.620$.

The unexposed Christiansen color of this cell upon projection was blue to transmitted light and yellow as viewed by scattered light, thus displaying true Christiansen characteristics.

After this cell was exposed to uv light through a line negative, a black image as viewed by transmitted light was obtained instead of a Christiansen color image of green to yellow orange. This was due to internal scattering resulting from a third phase.

CONTROL C

A Christiansen photosensitive cell was prepared as in Example 1 using 0.50 g p-xylylene diacrylate, 0.35 g 85% Arochlor 1260 in 1-chloronaphthalene, 0.15 g benzoin methyl ether, 0.20 g 1-chloronaphthalene, 0.30 g 1-methyl naphthalene, and 0.05 g 5% nitrosocyclohexane dimer in 1-chloronaphthalene together with sufficient powdered glass to produce a viscous slurry. The index of refraction of the liquid phase was $n_D = 1.598$ and that of the glass power $n_D = 1.620$.

The Christiansen color of the unexposed cell was a dark blue and the image formed after exposure was a greyish black. Thus, no Christiansen color was visible in the exposed area.

EXAMPLE 14

In this Example four photosensitive Christiansen cells were prepared containing a fixed amount of primary monomer (1-naphthyl methacrylate) but decreasing amounts of image-stabilizing monomer (triethylene glycol dimethacrylate). The amounts of some of the other additives used to adjust refractive index were varied slightly to compensate for the change in refractive index caused by decreasing the concentration of stabilizing monomer so that approximately the same Christiansen colors could be obtained with all of the cells. The basic composition of the liquid phase, exclusive of the dimethacrylate, was 0.45 g 85% Arochlor 1260 in 1-chloronaphthalene, 0.40 g 1-naphthyl methacrylate, 0.15 g benzoin methyl ether, 0.10 g 1-chloronaphthalene, and 0.05 g 5% nitrosocyclohexane dimer in 1-chloronaphthalene.

The following amounts of triethylene glycol dimethacrylate were used in the four compositions:

14A — 0.20 g
14B — 0.10 g
14C — 0.05 g
14D — 0.02 g

A Christiansen photosensitive cell was prepared with each composition after adding sufficient powdered glass of index of refraction $n_D = 1.620$ to produce a viscous slurry.

Each of the four samples was exposed for a time just sufficient to form a distinct positive line image and also for a longer time to obtain a nearly maximum color change. The unexposed Christiansen colors were blue to bluish black. The low exposure time images were lighter blues to light green and the high exposure time images were greenish yellow to orange.

After 3 days aging, both exposure level images for the cells of Examples 14A, 14B, and 14C, i.e., the three cells with the higher concentrations of image-stabilizing monomer, remain sharply resolved but the low exposure time image for the cell of Example 14D, i.e., the cell with the lowest concentration of image-stabilizing monomer, had almost faded and the high exposure time image showed loss of resolution. After 36 days aging, the images at both exposure time levels for the cells of Examples 14A, 14B, and 14C were still resolved. The low exposure time image for the cell of Example 14D was completely dissipated and the high exposure time image had become indistinct with no image edges being discernible. From these results it is evident that image-stabilizer concentrations below about 5% by weight based on the primary monomer provide at best only limited stability against aging.

What is claimed is:

1. In a method of forming a colored image by projection of light through an imaged Christiansen cell so that the light is separated into scattered and unscattered components either of which is focused on a viewing surface, said Christiansen cell having two constituents of different optical dispersion but having identical refractive indices at a matching wave-length in or near the visible spectrum the constituents being a discrete phase dispersed in an optically homogeneous polymerizable medium whose refractive index is locally changed by polymerization, the improvement comprising: forming an optically homogeneous, photopolymerizable medium containing a polymerizable monomer and a cross-linking monomer in an amount sufficient to produce upon exposure to actinic light cross-linked polymer which stabilizes the colored image formed and is optically homogeneous with any remaining medium; and exposing the Christiansen cell to varying intensities of actinic light in accordance with a predetermined image.

2. The method of claim 1 wherein the discrete phase is a transparent, isotropic, solid powder.

3. The method of claim 2 wherein the solid powder is glass.

4. The method of claim 3 wherein the medium additionally contains about 0.05–5 parts by weight, based on the weight of the medium, of a nitroso dimer, and up to about 90 parts by weight, based on the weight of the medium, of an additive for adjusting the refractive index or viscosity of the medium, said additive being optically homogeneous therewith.

5. The method of claim 3 wherein the medium comprises:
   a. about 10–100 parts by weight of reactive monomers which are:
      1. about 95–50 parts by weight based on (1) and (2) of at least one ethylenically unsaturated monomer, and
      2. about 5–50 parts by weight based on (1) and (2) of at least one cross-linking monomer for (1);
   b. about 0.1 to 20 parts by weight of a photoinitiator activatable by actinic light; and
   c. 0 to about 90 parts by weight of an additive for adjusting the refractive index or viscosity of the medium, said additive being optically homogeneous therewith.

6. The method of claim 5 wherein the medium consists essentially of about 30–75 parts of (a); about 0.5 to 15 parts of (b); about 20–65 parts of (c) and about 0.05–1 part of (d) a nitroso dimer.

7. A christiansen cell having as its operating element a dispersion of a transparent, isotropic solid in a photopolymerizable medium which is an optically homogeneous mixture of: (1) at least one ethylenically unsaturated monomer; (2) at least one cross-linking monomer for said unsaturated monomer in an amount sufficient to produce cross-linked polymer which is optically homogeneous with the medium; and (3) an initiating amount of an actinic light-activatable photoinitiator which does not form gaseous or insoluble products.

8. The Christiansen cell of claim 7 additionally containing in the dispersion about 0.05–5 parts by weight, based on the weight of the medium, of a nitroso dimer.

9. The Christiansen cell of claim 8 additionally containing up to 90 parts by weight, based on the weight of the medium of an additive for adjusting the refractive index the medium of an additive for adjusting the refractive index or viscosity of the medium said additive being optically homogeneous therewith.

10. The Christiansen cell of claim 9 wherein the dispersed phase is glass powder.

11. A Christiansen cell having as its operating element a dispersion of glass powder in a photopolymerizable medium consisting essentially of:
   a. about 30–75 parts by weight of reactive monomers which are:
      1. about 93–60 parts by weight based on (1) and (2) of at least one photopolymerizable, ethylenically unsaturated monomer and
      2. about 7–40 parts by weight, based on (1) and (2), of at least one cross-linking monomer for (1);
   b. about 0.5–15 parts by weight of a photoinitiator activatable by actinic light;
   c. about 20–65 parts by weight of an additive for adjusting the refractive index of the medium and which is optically homogeneous therewith; and
   d. about 0.05–1 part by weight of a nitrosoalkane dimer.

12. The Christiansen cell of claim 11 wherein the photopolymerizable, ethylenically unsaturated monomer is an aromatic acrylate or methacrylate.

13. The Christiansen cell of claim 12 wherein the cross-linking monomer is a divinyl aromatic compound, a di- or triacrylate or a di- or trimethacrylate.

14. The Christiansen cell of claim 13 wherein the photoinitiator is benzoin methyl ether.

15. The Christiansen cell of claim 14 wherein the additive (c) is poly(1-naphthyl methacrylate), poly(vinylnaphthalene), chlorinated polyphenyls, a chlorinated aromatic compound, or poly(1-cinnamyl methacrylate/1-naphthyl methacrylate); and the nitrosoalkane dimer (d) is nitrosocyclohexane dimer.

* * * * *